United States Patent [19]

Nishioka

[11] Patent Number: 5,570,427
[45] Date of Patent: Oct. 29, 1996

[54] MUTING CONTROL CIRCUIT

[75] Inventor: Kei Nishioka, Kyoto, Japan

[73] Assignee: Rohm Co., Ltd., Kyoto, Japan

[21] Appl. No.: 273,186

[22] Filed: Jul. 11, 1994

Related U.S. Application Data

[63] Continuation of Ser. No. 898,459, Jun. 15, 1992, abandoned.

[30] Foreign Application Priority Data

Nov. 20, 1991 [JP] Japan .................................. 3-304697

[51] Int. Cl.⁶ .................................................. H04B 15/00
[52] U.S. Cl. .......................................................... 381/94
[58] Field of Search ........................ 381/28, 94; 455/212, 455/213, 221, 218; 307/246; 327/319, 322, 308, 478

[56] References Cited

U.S. PATENT DOCUMENTS 4,132,953 1/1979 Martin, III .............................. 455/212
4,914,715 4/1990 Miyata ..................................... 455/221

*Primary Examiner*—Curtis Kuntz
*Assistant Examiner*—Ping W. Lee
*Attorney, Agent, or Firm*—Morrison Law Firm; Alfred W. Froebrich

[57] ABSTRACT

There is substantially provided a muting control circuit in which there is no difference in muting time between the muting utilizing capacitor charging and that utilizing capacitor discharging. A constant current source is in parallel with an external capacitor. The constant current source operates so as to decrease a charging current in the course of charging the external capacitor 20, whereas it operates so as to increase a discharging current in the course of discharging. Therefore, no substantial difference in muting time occurs.

4 Claims, 6 Drawing Sheets

F I G. 5A
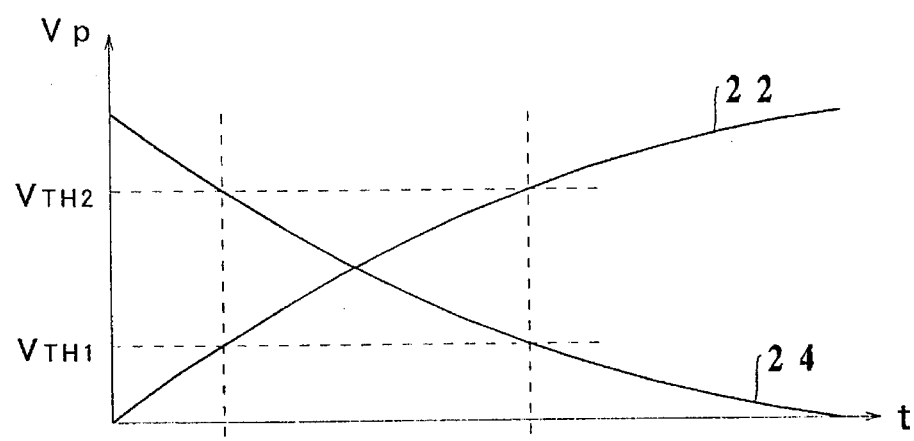
F I G. 5B
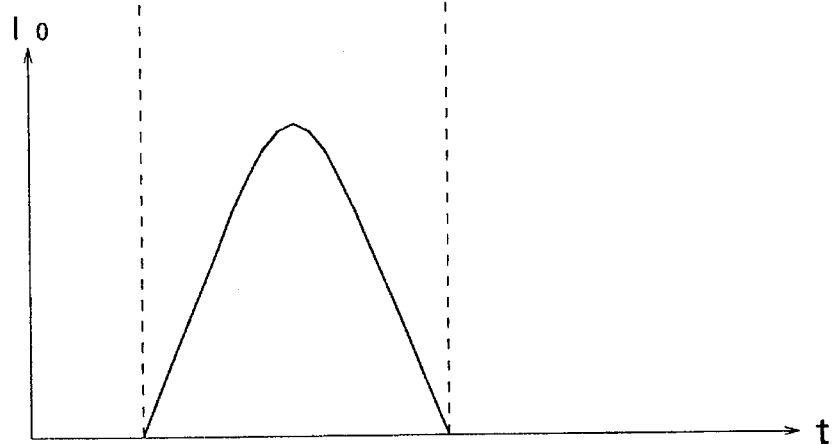

MUTING CONTROL CIRCUIT

This is a continuation of application Ser. No. 07/898,459 filed on Jun. 15, 1992, now abandoned.

BACKGROUND OF THE INVENTION

1. Field of the Invention

The present invention relates to a muting control circuit and, more particularly, to the improvement in muting characteristics.

2. Description of the Prior Art

In audio systems or the like, a muting circuit is provided for eliminating click noise which is generated at the moment of throwing switch of the system. In FIG. 1 there is shown a conventional muting control circuit. A terminal 2 is an input terminal for inputting a signal to be muted, and a terminal 4 is an output terminal. In Response to a high current $I_o$ outputted from a control circuit 6, the terminal 4 outputs less, thus muting is performed.

The control circuit 6 is provided for varying the output current $I_o$ depending upon the voltage at a controlling input terminal $T_c$. The control circuit 6 allows the output current $I_o$ to be increased with increasing voltage of the controlling input terminal $T_c$ to the maximum point, as shown in FIG. 2. It also allows the output current $I_o$ to be decreased in the case of a further rise in voltage. Muting is performed by the output current $I_o$.

An external resistance $R_1$ and an external capacitor $C_1$ are connected to the controlling input terminal $T_c$. A curve 10 in FIG. 3A shows the voltage at the controlling input terminal $T_c$ in the case where voltage is applied to one end of the resistance R1 or a terminal 8. By applying the voltage, charging of the external capacitor $C_1$ is initiated. The voltage $V_p$ at the controlling input terminal $T_c$ increases with increasing time according to a curve 10 in FIG. 3A. At the moment when the voltage $V_p$ exceeds a first threshold $V_{TH1}$, the output current $I_o$ is allowed to flow, so that muting is initiated (α in FIG. 3B). The output current $I_o$ increases with increasing voltage $V_p$, and after a peak β, it decreases. Further, when the voltage $V_p$ exceeds a second threshold $V_{TH2}$, the output current $I_o$ becomes equal to zero, thus muting is achieved (γ in FIG. 3B).

As mentioned above, by varying the terminal 8 voltage from an L level to an H level, muting can be performed for a desired time.

Muting also occurs when, the terminal 8 voltage at the H level is lowered to the L level. This is carried out by varying the voltage $V_p$ according to a curve 12 shown in FIG. 3A. As a result, the output current $I_o$ varies as shown in a curve 14 of FIG. 3B. However, the conventional muting circuit described above has the following problem.

In order to raise the terminal 8 of L level to H level (usually source voltage), a voltage of H level is applied to the external capacitor ₁. This causes the external capacitor $C_1$ to be charged rapidly, so that the voltage V at the controlling input terminal $T_c$ is made to increase rapidly (curve 10 in FIG. 3A).

On the contrary, when the terminal 8 of H level is lowered to L level, the external capacitor $C_1$ at the level of a charged voltage discharges. The external capacitor $C_1$, however, is such that it is not charged by the applied voltage to the terminal 8, but by a divided voltage which is determined by dividing the applied voltage using $R_1$ and $R_2$. As a result, discharge of the external capacitor $C_1$ is carried out more slowly as compared with the case of charge thereof.

This means that there is the difference in muting time between the case where the terminal 8 of L level is raised to H level (when charging the capacitor $C_1$.) and the case where the terminal 8 of H level is lowered to L level (when discharging the capacitor $C_1$). Consequently, if the muting is the best suited for the change from H level to L level, the output current $I_o$ is made to change too sharply from L level to H level, as shown in FIG. 3B. For this reason, there is the possibility of shock noise.

OBJECTS AND SUMMARY OF THE INVENTION

An object of the present invention, therefore, is to overcome the aforementioned problem and provide a muting control circuit in which there is no difference in muting time between the muting utilizing capacitor charging and that utilizing capacitor discharging.

According to a feature of the invention, there is provided a muting control circuit comprising:

a controlling input terminal which is connected to a common junction point of an external resistance and an external capacitor joined up in series;

a control circuit which allows a muting control output to begin when a voltage at the controlling input terminal exceeds a first threshold, the output being allowed to gradually increase with increasing voltage thereat and to gradually decrease with further increasing voltage thereat, and allows the muting control output to cease when the voltage exceeds a second threshold; and a compensating current source provided in parallel with the external capacitor, being connected to the controlling input terminal.

According to a further feature of the invention, there is provided a muting control circuit comprising:

an external resistance whose one end is connected to a power source;

an external capacitor whose one end is connected to the other end of the external resistance, the other end being grounded;

an internal resistance whose one end is connected to a common junction point of the external resistance and the external capacitor, the other end being grounded;

a compensating current source connected in parallel with the internal resistance; and a control circuit which allows a muting control output to begin outputting when a voltage across the external capacitor exceeds a first threshold, the output being allowed to gradually increase with increasing voltage thereat and to gradually decrease with further increasing voltage thereat, and allows the muting control output to be stopped outputting when the voltage exceeds a second threshold.

According to a still further feature of the invention, there is provided a method for muting control comprising the steps of:

allowing a muting control output to begin outputting when a voltage across an external capacitor exceeds a first threshold, the output being allowed to gradually increase with increasing voltage thereat and to gradually decrease with further increasing voltage thereat, and of allowing the muting control output to cease stopped outputting when the voltage exceeds a second threshold, wherein a compensating current source is provided in parallel with the external capacitor, whereby the external capacitor is so controlled as to allow less current to flow thereto in the course of charging process and allow more current to flow therefrom in the course of discharging process.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 5 is a diagram showing the operation of the circuit of FIG. 4.

DESCRIPTION OF THE PREFERRED EMBODIMENT

Figure 4:
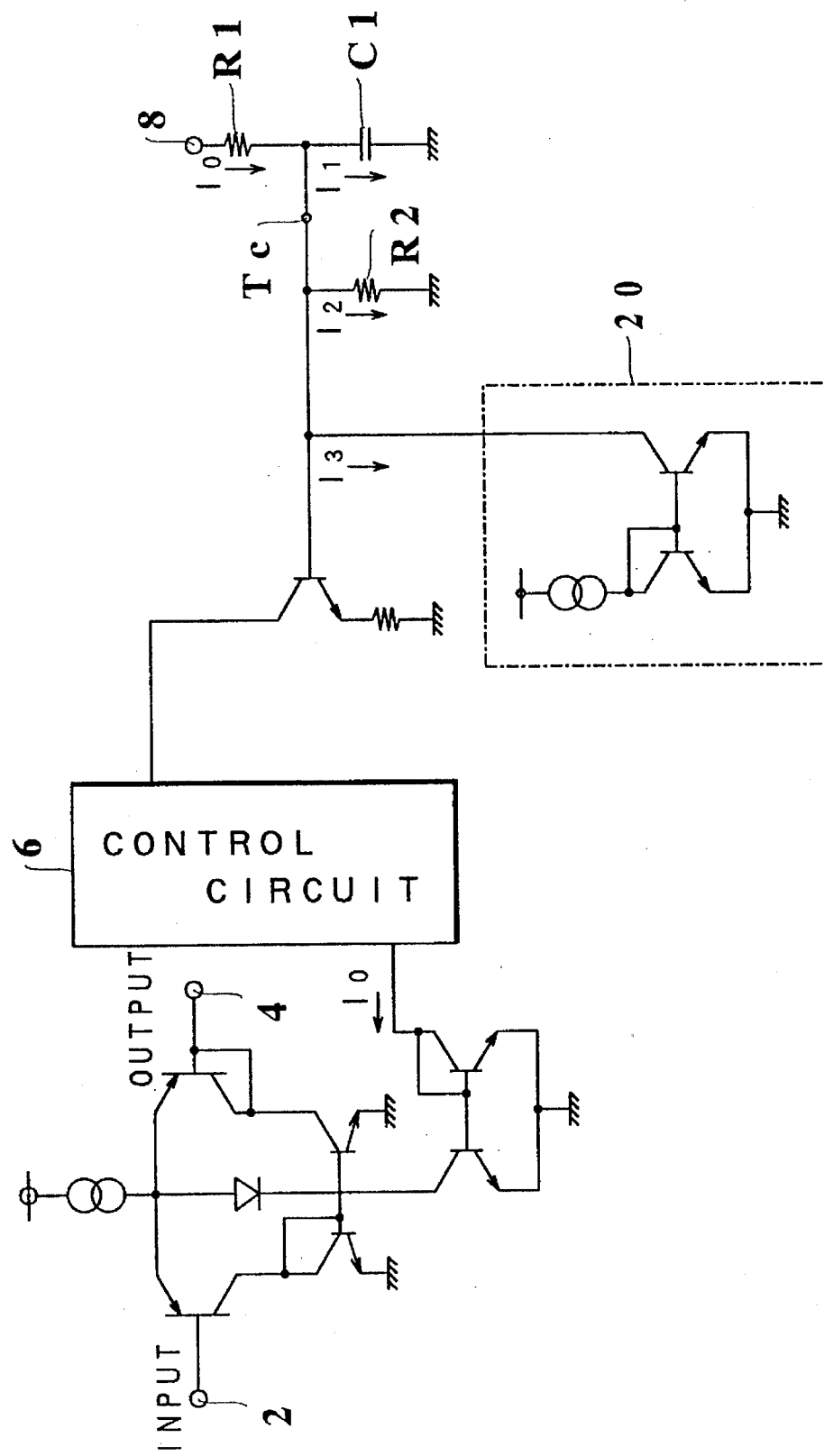
FIG. 4 is a diagram showing a muting control circuit according to an embodiment of the present invention.

In FIG. 4 there is shown a muting control circuit according to an embodiment of the present invention. A constant current source 20 acting as compensating current source is provided in parallel with an external capacitor $C_1$. A terminal 2 is an input terminal for inputting a signal to be muted, and a terminal 4 is an output terminal. Responding to high output current $I_o$ outputted from a control circuit 6, the terminal 4 outputs less, thus muting is performed.

Figure 1:
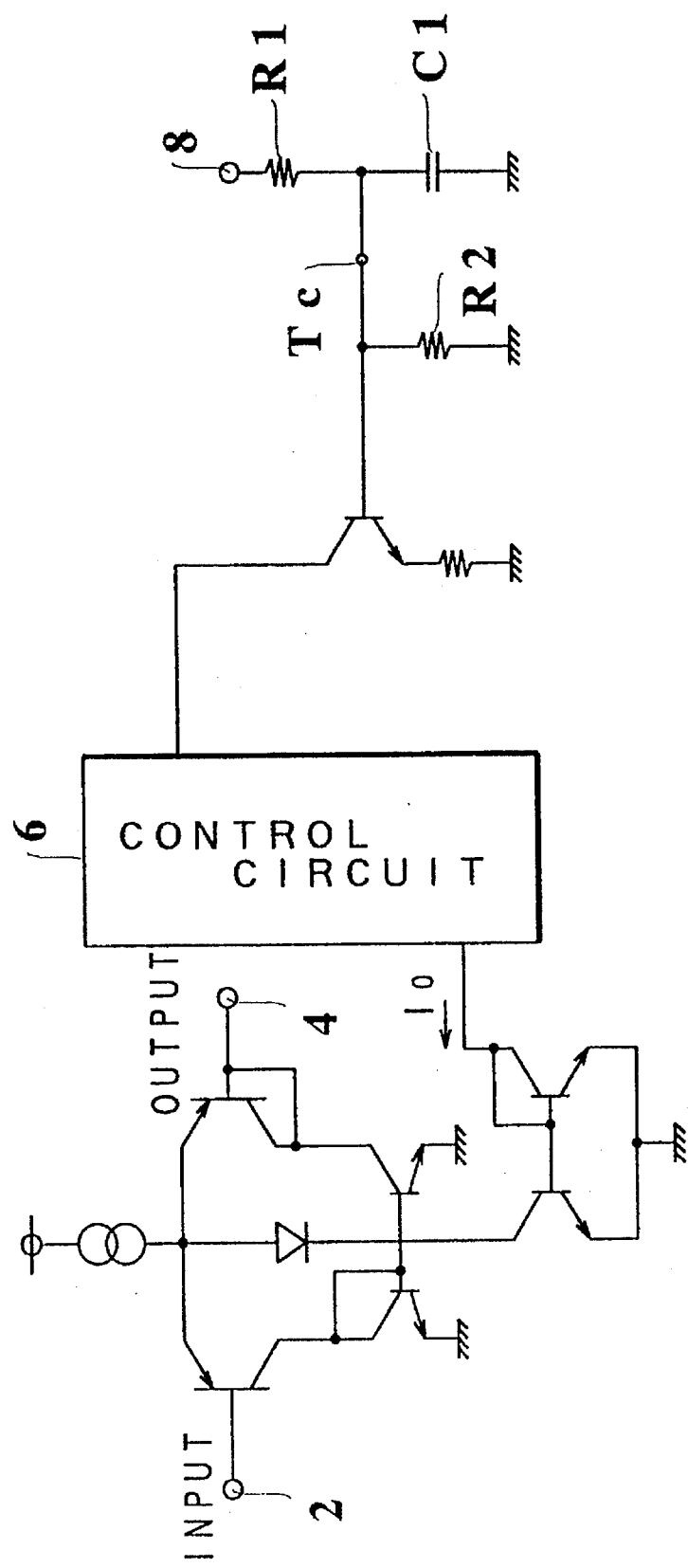
FIG. 1 is a diagram showing a conventional muting control circuit.
Figure 2:
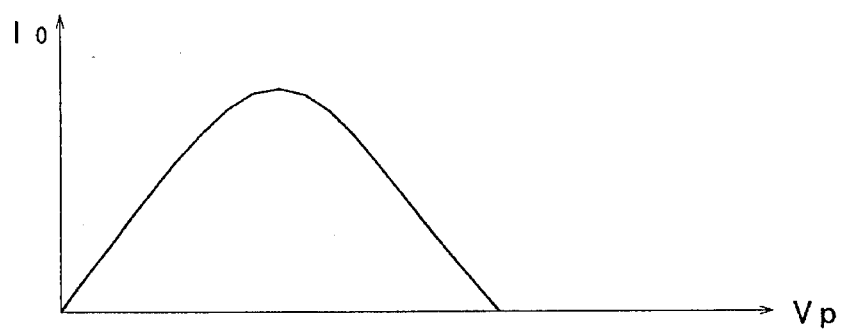
FIG. 2 is a diagram showing the operation of the control circuit 6 of FIG. 1.
Figure 3A:
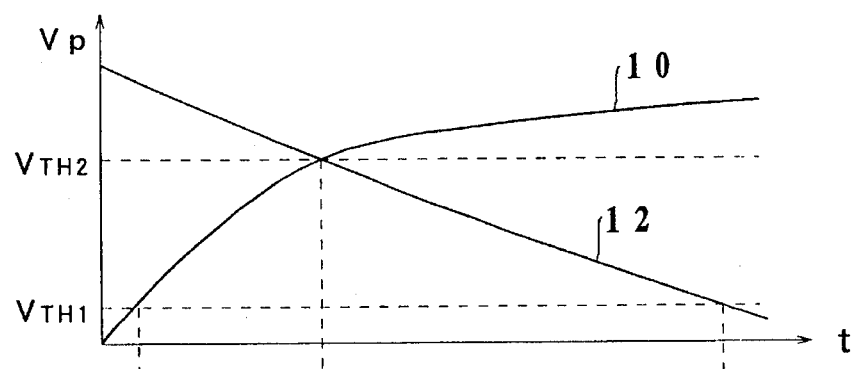
FIG. 3 is a diagram showing the operation of the circuit of FIG. 1.
Figure 3B:
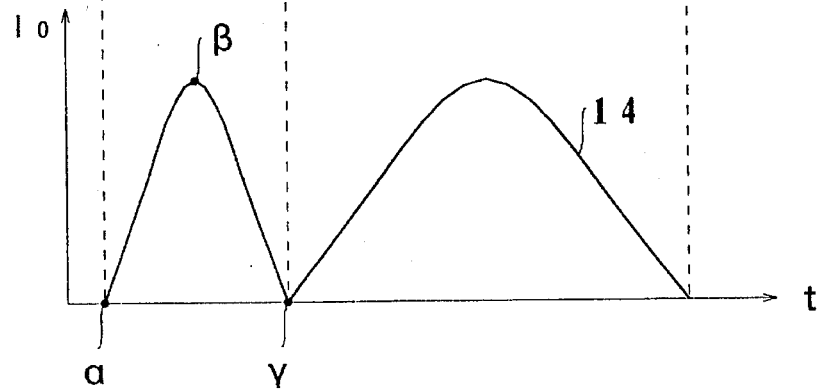

The control circuit 6 is provided for varying the output current $I_o$ depending upon the voltage at a controlling input terminal $T_c$. The control circuit 6 allows the output current $I_o$ to be increased with increasing voltage of the controlling input terminal $T_c$, as shown in FIG. 2. It also allows the output current $I_o$ to be decreased in the case of a further rise in voltage.

Figure 6:
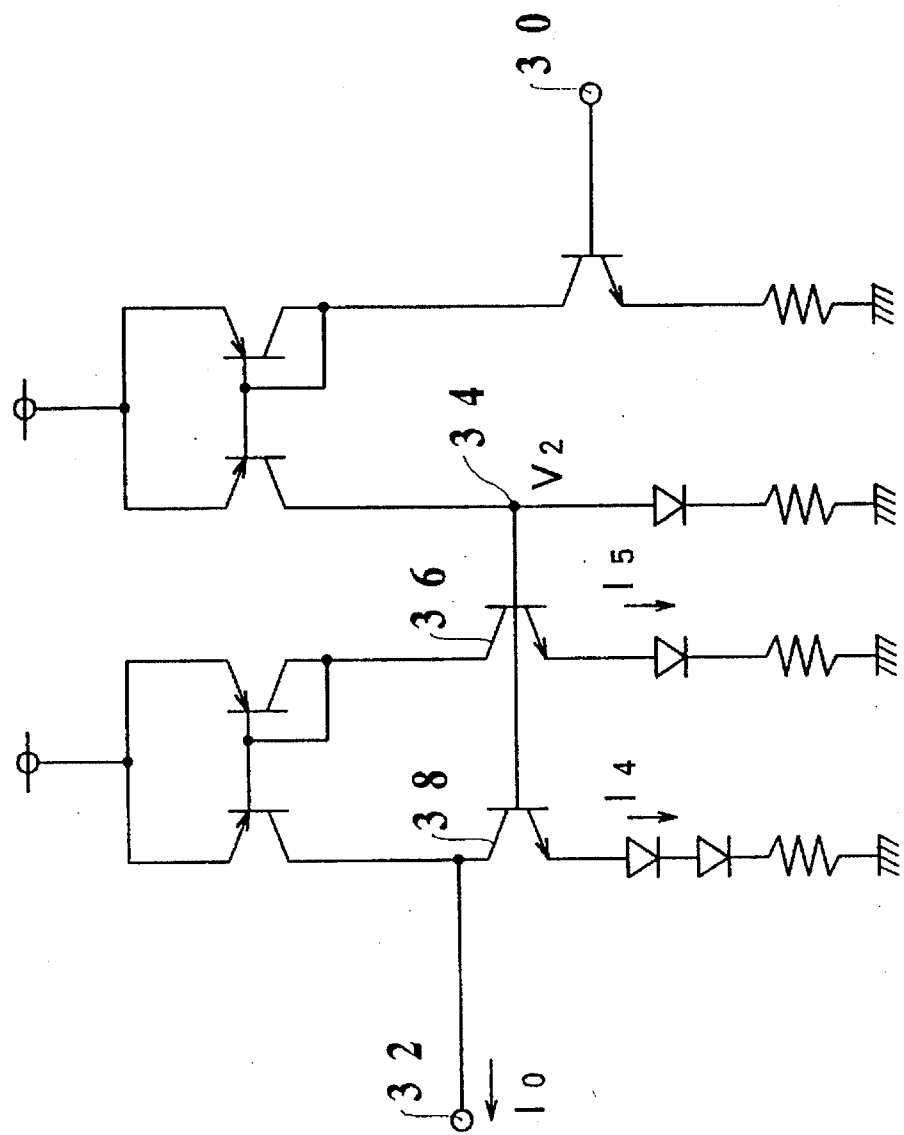
FIG. 6 is a diagram showing details of the control circuit 6 of FIG. 4.
Figure 7A:
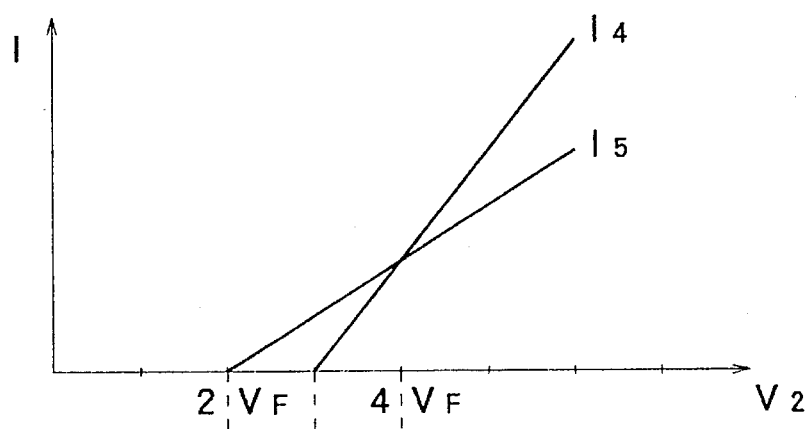
FIG. 7 is a diagram explanatory of the operation of the circuit of FIG. 6.
Figure 7B:
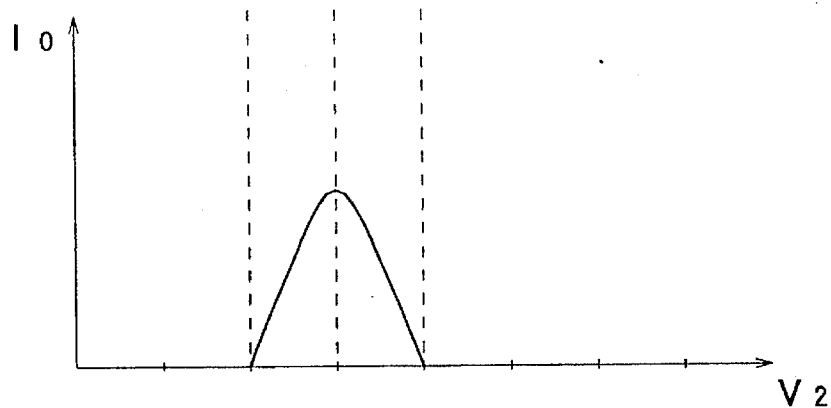

Details of the control circuit 6 is shown in FIG. 6. A terminal 30 and a terminal 32 are an input terminal and an output terminal, respectively. The voltage $V_2$ of a junction point 34 increases with increasing voltage of the terminal 30. A transistor 36 starts to conduct electricity at the moment when the voltage $V_2$ exceeds $2V_F$ ($V_F$ is a forward voltage of the diode), with the result that the current $I_5$ increases, as shown in FIG. 7A. Then, a transistor 38 starts to conduct electricity at the moment when the voltage $V_2$ exceeds $3V_F$, with the result that the current $I_4$ increases. The rise in the current $I_4$ is so arranged as to surpass the rise in the current $I_5$. Further, the output terminal 32 outputs the current equivalent to ($I_5-I_4$). Consequently, the current shown in FIG. 7B can be obtained from the terminal 32. Muting is performed using this output current $I_o$.

The operation of the circuit in the case where a terminal 8 of L level is raised to H level (when charging the capacitor $C_1$) will be explained in accordance with FIG. 4. By raising the terminal 8 to H level, charging the external capacitor $C_1$ is initiated. A charging current $I_1$ at this moment is equivalent to a sum of the current $i_2$ through a resistance $R_2$ plus the current $I_3$ down by the constant current source 20, subtracted from the current $I_0$ through an external resistance $R_1$. This means that the charging current $I_1$ is less than that in the conventional circuit by the current $I_3$ of the constant current source 20. As a result, the external capacitor $C_1$ is made to moderately charge according to a curve 22 in FIG. 5A, thus suppressing the rapid charging done in the conventional circuit. Simultaneously, the control circuit 6 outputs the output current $I_o$ shown in FIG. 5B, to thereby conduct muting.

Next, the operation of the circuit in the case where the terminal 8 of H level is lowered to L level (when discharging the capacitor $C_1$) will be explained. By lowering the terminal 8 to L level, discharging the external capacitor $C_1$ is initiated. A discharging current $I_1$ at this moment is equivalent to the sum of current $I_3$ down by the constant current source 20 plus the current $I_2$ through a resistance $R_2$. This means that the discharging current $I_1$ is more than that in the conventional circuit by the current $I_3$ of the constant current source 20. As a result, the external capacitor $C_1$ is made to discharge more rapidly than one in the conventional circuit. Simultaneously, the control circuit 6 outputs the output current $I_o$ shown in FIG. 5B, to thereby conduct muting.

It will be clearly understood that, by properly setting the current $I_3$ of the constant current source 20, the muting time can be arranged so as to be identical both in the course of charging and of discharging the capacitor $C_1$, as shown in FIG. 5B.

Further, the value of the current Is must be determined so that it allows an identical muting time both in the course of charging process and in the course of discharging process. First, time constants in the absence of the constant current source 20 are determined. Time constants are given by:

$$\tau_H = C1 \times (V_{co}/2)/(V_{co}/R_1)$$

$$\tau_L = C1 \times (V_{co}/2)/(V_{co}/2R_2)$$

wherein $\tau_H$ and $\tau_L$ are the time constant in the course of charging process and one in the course of discharging process, respectively. $V_{co}$ is the applied voltage to the terminal 8, and $R_1$ is identical to $R_2$. The $\tau_H$ is not equal to $\tau_L$, but twice as large as $\tau_L$.

On the other hand, respective time constants in the presence of the $I_s$ of the constant current source 20 are given by:

$$\tau_H = C1 \times (V_{co}/2)/((V_{co}R_1)-I_3)$$

$$\tau_L = C1 \times (V_{co}/2)/((V_{co}/2R_2)+I_3)$$

Here, the following relation is required in order to equalize $\tau_H$ and $\tau_L$.

$$V_{co}R_1 - I_3 = V_{co}/2R_2 = I_3$$

Because $V_{co}R_1 = I_o$, and $V_{co}/2R_2 = I_2$, the above expressions are given by:

$$I_3 = (I_o - I_2)/2$$

Therefore, if the $I_3$ is determined so as to meet the above-mentioned requirement, $\tau_H$ and $\tau_L$ can be equalized. Accordingly, the muting time can be arranged so as to be identical both in the course of charging process and in the course of discharging process.

In the embodiment described above, although the constant current source 20 is used, it may be substituted for by a variable current power supply.

In a muting control circuit of the present invention, a compensating current source is provided in parallel with an external capacitor. The compensating current source thus provided operates so as to decrease a charging current in the course of charging the external capacitor, whereas it operates so as to increase a discharging current in the course of discharging the capacitor.

Accordingly, the present invention can provide a muting control circuit in which there is no difference in muting time between the muting utilizing capacitor charging and that utilizing capacitor discharging.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A muting control circuit comprising:

an external resistance in series with an external capacitor between a terminal and a fixed reference voltage;

said terminal alternately receiving first and second voltage levels;

said first voltage level being lower than said second voltage level whereby said external capacitor charges when said terminal is switched from said first to said second voltage level, and said external capacitor discharges when said terminal is switched from said second voltage level to said first voltage level;

a junction connecting said external resistance to said external capacitor;

a control circuit including means for applying a third voltage from said junction to control an output of said control circuit;

said control circuit including means, responsive to said voltage from said junction, for supplying a muting control output current;

said means for supplying includes means for initiating output of said muting control output current when a control voltage across said capacitor exceeds a first threshold;

said means for supplying includes means for gradually increasing said muting control output current as said control voltage is increased and gradually decreasing said muting control output current as said control voltage is further increased;

said means for supplying including means for ceasing to supply said muting control output current when said control voltage exceeds a second threshold; and a compensating current source in parallel with said external capacitor;

said compensating current source being effective to decrease a charging time of said capacitor and increase a discharging time of said capacitor.

2. A muting control circuit comprising:

an external resistance with one end connected to a power source;

an external capacitor whose one end is connected to the other end of the external resistance, the other end being grounded;

an internal resistance in parallel with said external capacitor whose one end is connected to a common junction point of the external resistance and external capacitor, the other end being grounded;

a compensating current source connected in parallel with said internal resistance;

said compensating current source effective to decrease a charging rate of said capacitor and increase a discharging rate of said capacitor; and a control circuit which allows a muting control output to begin outputting when a voltage at both ends of the external capacitor exceeds a first threshold, the output being allowed to gradually increase with increasing voltage thereat, and allows the muting control output to cease outputting when the voltage exceeds a second threshold.

3. A method for muting control comprising the steps of;

charging and discharging a capacitor through a resistance by applying first and second differing potentials;

applying a voltage across said capacitor to a controlling input terminal of a control circuit;

initiating a muting control output current from said control circuit when said voltage across said capacitor exceeds a first threshold;

increasing gradually said muting control output current as said voltage across said capacitor increases;

decreasing gradually said muting control output current as said voltage across said capacitor further increases;

terminating said muting control output current when said voltage across said capacitor exceeds a second threshold; and applying a predetermined compensating current to said capacitor, to said compensating current effective to decrease a charge rate during said charging of said capacitor and increase a discharge rate during said discharging of said capacitor.

4. The muting control circuit as described in claim 1, wherein:

said compensating current source is a constant current source whereby, as a voltage at said terminal varies between said first and said second voltage levels, said charge time and said discharge time of said capacitor are of substantially equal duration.

* * * * *